(12) United States Patent  (10) Patent No.: US 8,316,341 B2
Sandy et al.                (45) Date of Patent:     Nov. 20, 2012

(54) HARDWARE DESCRIPTION LANGUAGE (HDL) GENERATION SYSTEMS AND METHODS FOR CUSTOM CIRCUIT BOARDS

(75) Inventors: Douglas L. Sandy, Chandler, AZ (US); Shlomo Pri-Tal, Phoenix, AZ (US)

(73) Assignee: Emerson Network Power—Embedded Computing, Inc., Tempe, AZ (US)

( * ) Notice: Subject to any disclaimer, the term of this patent is extended or adjusted under 35 U.S.C. 154(b) by 425 days.

(21) Appl. No.: 12/561,329

(22) Filed: Sep. 17, 2009

(65) Prior Publication Data

US 2011/0066992 A1    Mar. 17, 2011

(51) Int. Cl.
*G06F 17/50* (2006.01)

(52) U.S. Cl. ......... 716/137; 716/100; 716/122; 716/132

(58) Field of Classification Search .................. 716/100, 716/104, 118, 119, 122, 126, 132, 137
See application file for complete search history.

(56) References Cited

U.S. PATENT DOCUMENTS 7,533,361 B2 * 5/2009 Edwards ........................ 716/137
7,860,919 B1 * 12/2010 Patsenker et al. ............. 709/201
* cited by examiner

*Primary Examiner* — Sun Lin
(74) *Attorney, Agent, or Firm* — Harness, Dickey & Pierce, P.L.C.

(57) ABSTRACT

A system comprises an input and a hardware description language (HDL) module. The input receives design specifications for a custom circuit board. The design specifications are selected from predetermined design options for custom circuit boards. The hardware description language (HDL) module generates HDL corresponding to the design specifications and outputs the HDL to a circuit board producer.

84 Claims, 9 Drawing Sheets

Form Factor (select one) ~302
- ○ Advanced TCA
- ○ Embedded ATX

FIG. 3A

CPU & Chipset Selection (select one) ~304
- ○ Dual X5000, 2.2 GHz, Integrated Memory Controller
- ○ Dual X5000, 1.5 GHz, Integrated Memory Controller
- ○ Dual Y2000, 1.0 GHz, YZZ Chipset
- ○ Single X5000, 2.4 GHz, Integrated Memory Controller
- ○ Single Y2000, 1.5 GHz, YZZ Chipset

FIG. 3B

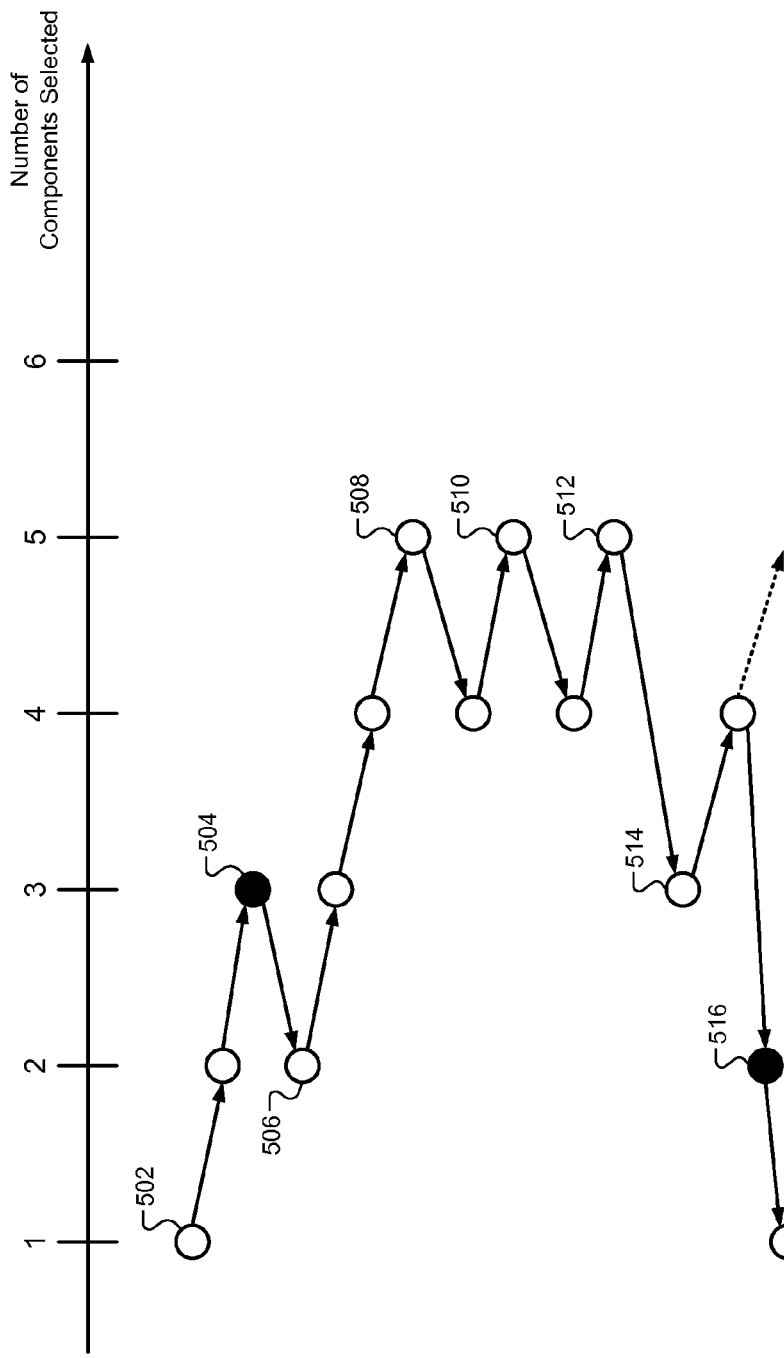

HARDWARE DESCRIPTION LANGUAGE (HDL) GENERATION SYSTEMS AND METHODS FOR CUSTOM CIRCUIT BOARDS

FIELD

The present disclosure relates to custom circuit boards.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The process of producing a circuit board that is customized according to requirements provided by a customer generally begins with collecting the requirements from the customer. A feasibility study may then be conducted to determine whether a custom circuit board that satisfies the customer's requirements can feasibly be produced. If so, an initial design of the circuit board is manually created (e.g., hand drawn), and the initial design is presented to the customer for approval.

After the customer approves of the initial design, an engineer authors a schematic netlist, bill of materials (BOM), and other data that is necessary for production of a first prototype of the custom circuit board. The data is sent to a board designer who is responsible for determining the physical construction and routing of the design using specialized computer aided design (CAD) tools. This data, in turn is provided to a circuit board fabricator that produces the first prototype of the custom circuit board according to the data. In some cases, the designer of the custom circuit board may also serve as the board designer of the custom circuit board.

Comprehensive testing and debugging may be performed on the first prototype. The custom circuit board may be produced and presented to the customer after modifications are made, as necessary, pursuant to the testing and debugging of the first prototype. The period between the collection of the requirements and the production of the custom circuit board may consume a period of approximately six months. By way of non-limiting example and comparison, the custom circuit board may cost the customer approximately one-hundred-thousand dollars (100,000.00 USD).

SUMMARY

A system comprises an input and a hardware description language (HDL) module. The input receives design specifications for a custom circuit board. The design specifications are selected from predetermined design options for custom circuit boards. The hardware description language (HDL) module generates HDL corresponding to the design specifications and outputs the HDL to a circuit board producer.

In other implementations, a system comprises a planner module and a code generator module. The planner module receives design specifications input for production of a custom circuit board, selects components for the custom circuit board based on the design specifications, determines an arrangement for the components on the custom circuit board, and generates initial design data for the custom circuit board based on the components and the arrangement. The code generator module generates hardware description language (HDL) that is provided to a circuit board producer for production of the custom circuit board based on the initial design data.

In still other implementations, a system comprises a planner module and a code generator module. The planner module receives design specifications for a custom circuit board, selects components for the custom circuit board based on the design specifications, determines an arrangement for the components on the custom circuit board, and generates initial design data for the custom circuit board based on the components and the arrangement. The planner module selects the components for the custom circuit board from predefined components stored in a database. The code generator module generates hardware description language (HDL) that is provided to a circuit board producer for production of the custom circuit board based on the initial design data. The custom circuit board includes one of a motherboard, a computer on module (COM) board, an advanced telecom computing architecture (ATCA) blade board, a CompactPCI (CPCI) blade board, and a VERSAModule Eurocard Bus (VME) blade board. The design specifications are selected from predetermined design options.

A method comprises: receiving design specifications for a custom circuit board, wherein the design specifications are selected from predetermined design options for custom circuit boards; generating hardware description language (HDL) corresponding to the design specifications; and outputting the HDL to a circuit board producer.

In other implementations, a method comprises: receiving design specifications for a custom circuit board; selecting components for the custom circuit board based on the design specifications; determining an arrangement for the components on the custom circuit board; generating initial design data for the custom circuit board based on the components and the arrangement; and generating hardware description language (HDL) that is provided to a circuit board designer for physical design and layout of the custom circuit board based on the initial design data. The custom circuit board includes one of a motherboard, a computer on module (COM) board, and an advanced telecom computing architecture (ATCA) blade board, a CompactPCI (CPCI) blade board, and a VME blade board. The design specifications are selected from predetermined design options. The components are selected from predefined components stored in a database.

Further areas of applicability of the present disclosure will become apparent from the detailed description provided hereinafter. It should be understood that the detailed description and specific examples are intended for purposes of illustration only and are not intended to limit the scope of the disclosure.

DRAWINGS

The present disclosure will become more fully understood from the detailed description and the accompanying drawings, wherein:

FIGS. 3A-3E depict an exemplary user input scenario presented to a user for inputting design specifications for a custom circuit board;

FIG. 5 is an exemplary illustration of how components are selected for implementation on a custom circuit board.

DETAILED DESCRIPTION

Figure 1:
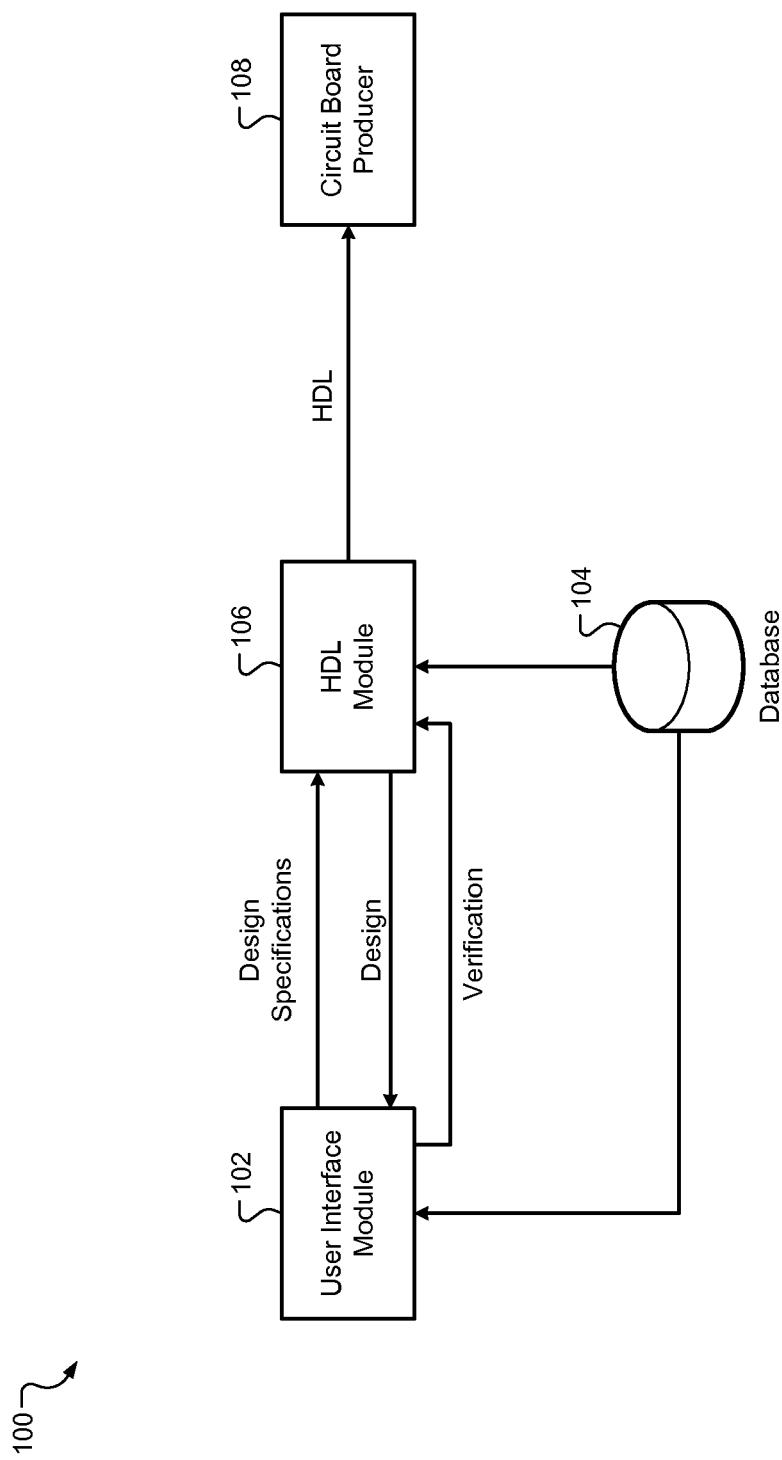
FIG. 1 is a functional block diagram of an exemplary implementation of a custom circuit board production system.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

A hardware description language (HDL) module according to the present disclosure receives design specifications for a custom circuit board. The HDL module selects components to be implemented on the custom circuit board that satisfy the design specifications. The HDL module also determines an arrangement for placement of the selected components on the custom circuit board. The HDL module generates HDL for the custom circuit board and provides the HDL to a circuit board producer that produces the custom circuit board using the HDL.

Automating the process of producing a custom circuit board reduces the period of time necessary to produce the custom circuit board. Automating the design process also enables cost savings to be passed along to customers. By way of non-limiting example and comparison, the period of time necessary to produce the custom circuit board may be approximately one-month and production of the custom circuit board may cost approximately two-thousand dollars (2,000.00 USD).

Referring now to FIG. 1, a functional block diagram of an exemplary custom circuit board production system 100 is presented. The custom circuit board production system 100 includes a user interface module 102, a database 104, a hardware description language (HDL) module 106, and a circuit board producer 108.

A user (e.g., a customer) inputs the user's requirements for a custom circuit board using the user interface module 102. In other words, the user inputs design specifications for the custom circuit board via the user interface module 102. For example only, the user interface module 102 may include a website that the user accesses, an application or program that the user may run, or another order entry interface.

The user is presented with predetermined design options for the custom circuit board via the user interface module 102, and the user selects the design specifications from the predetermined design options. The predetermined design options for the custom circuit board may include, for example, a form factor for the custom circuit board and functional requirements for the custom circuit board. For example only, the predetermined design options relating to the form factor may include a motherboard, a computer on module (COM), an advanced telecom computing architecture (ATCA) blade board, a board under the PCI Industrial Computer Manufacturers Group (PICMG) standards, or another suitable circuit board form factor. The predetermined design options relating to the functional requirements for the custom circuit board may include, for example, processor speed, chipset, memory configuration, expansion slots, on-board peripherals, and other characteristics suitable for custom circuit boards.

The user interface module 102 provides the design specifications for the custom circuit board to the HDL module 106. The HDL module 106 generates a design for the custom circuit board based on the design specifications. More specifically, the HDL module 106 selects components to be implemented on the custom circuit board from data stored in the database 104. The HDL module 106 may select the components to minimize the cost of the custom circuit board. The HDL module 106 also selects the components to adhere to constraints (e.g., airflow, height, area) imposed on the form factor selected and/or the components selected to be implemented on the custom circuit board. In some implementations, the HDL module 106 may balance one or more characteristics (e.g., speed and cost).

Once the components have been selected for the custom circuit board, the HDL module 106 determines an arrangement for the components on the custom circuit board. The HDL module 106 generates an initial design for the custom circuit board using the components selected and the arrangement determined for the selected components.

In some implementations, the HDL module 106 provides the initial design to the user interface module 102 for presentment to the user. In such implementations, the user may have an opportunity to approve or disapprove of the initial design, and the HDL module 106 may wait for the approval of the user before proceeding. The HDL module 106 may generate a different design for the custom circuit board if the user disapproves of the initial design. The different design may include one or more different components that achieve the design specifications or a different arrangement of the same components.

The HDL module 106 finalizes the design for the custom circuit board and generates hardware description language (HDL) based on the design. The HDL module 106 provides the HDL to the circuit board producer 108. For example only, the HDL may be written in Verilog, System C, very high-speed integrated circuit HDL (VHDL), or another suitable type of HDL. The HDL may include, for example, one or more of a netlist, a bill of materials, setup data for the processor to be implemented on the custom circuit board, testing data for post-production testing/debugging of the custom circuit board, and placement data for arranging the selected components on the custom circuit board.

The circuit board producer 108 produces the custom circuit board according to the HDL. More specifically, the circuit board producer 108 may route the circuit board according to the HDL and apply an electrically conductive material (e.g., copper) to the routes. The circuit board producer 108 also attaches the components to the custom circuit board and establishes electrical connections as specified in the HDL. The circuit board producer 108 may also upload the setup data, and other data to the custom circuit board.

Figure 2:
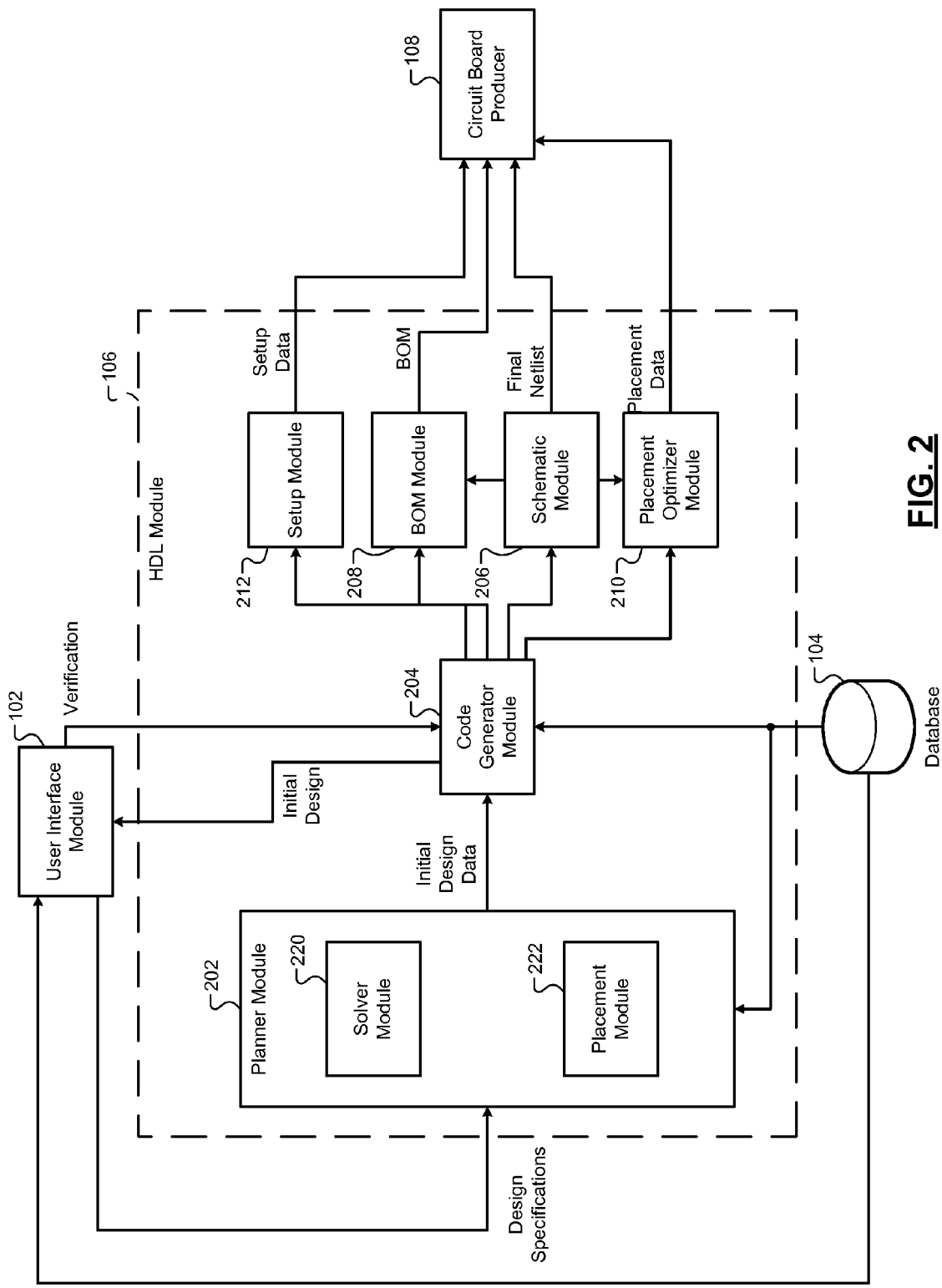
FIG. 2 is a functional block diagram of another exemplary implementation of the circuit board production system including an exemplary implementation of a hardware description language (HDL) module.

Referring now to FIG. 2, another functional block diagram of the exemplary custom circuit board production system 100 is presented. The exemplary custom circuit board production system 100 of FIG. 2 includes a functional block diagram of an exemplary implementation of the HDL module 106.

The user selects the design specifications for the custom circuit board from predetermined design options. In some implementations, the user may select the design specifications from drop-down lists of the predetermined design options. In other implementations, the user may be presented with some of the predetermined design options and prompted to select from those options. The user may be presented with some of the predetermined design options in a predetermined order. For example only, the predetermined order may be: first, form factor; second, processor speed and chipset; third, memory amount, type, and configuration; fourth, expansion slots; and fifth, on-board peripherals. FIGS. 3A-3E depict an exemplary user input scenario presented to the user via the user interface module 102.

Referring to FIG. 3A, a first set of predetermined design options 302 may be presented to the user. The first set of predetermined design options 302 for the custom circuit board may relate to the form factor of the custom circuit board. For purposes of illustration and simplicity only, the user may be presented with circuit board form factors of an Advanced TCA board and an Embedded ATX board. The user may also be presented with other circuit board form factors as discussed further below.

Assuming that the user selects the Embedded ATX option from the first set of predetermined design options 302, the user may be presented with a second set of predetermined design options 304 as shown in FIG. 3B. For example only, the second set of predetermined design options 304 may relate to the processor (e.g., speed and chipset) to be implemented on the custom circuit board. If the user selects the Advanced TCA option from the first set of predetermined design options 302, the user may be presented with predetermined design options that are specific to Advanced TCA boards.

Figures 3C, 3D:
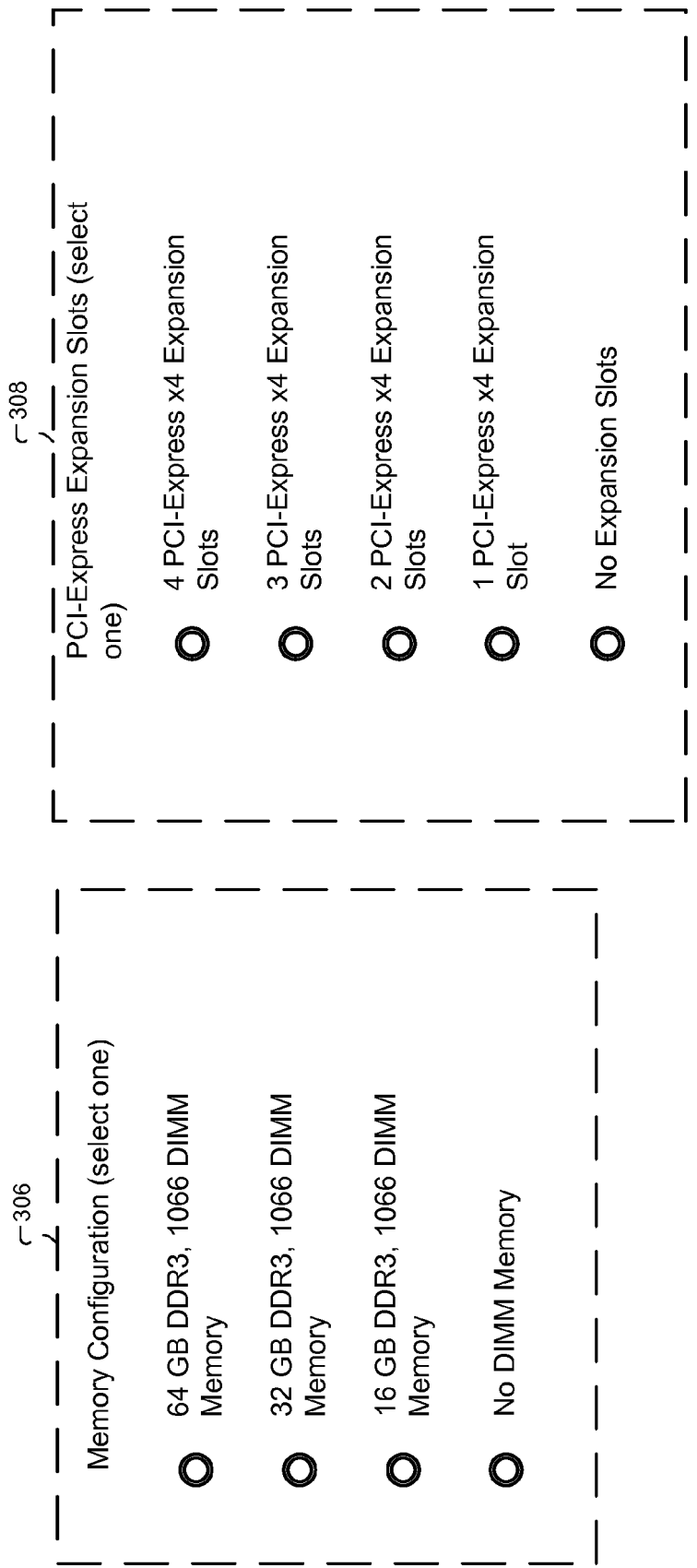

The user may be presented with a third set of predetermined design options 306 once the user selects the processor as shown in FIG. 3C. For example only, the third set of predetermined design options 306 may relate to memory to be implemented on the custom circuit board. In some implementations, the configuration of the memory may be specified relative to the processor selected from the second set of predetermined design options 302.

Once the memory has been selected from the third set of predetermined design options 306, the user may be presented with a fourth set of predetermined design options 308 as shown in FIG. 3D. For example only, the fourth set of predetermined design options 308 may relate to a number of PCI-Express expansion slots to be implemented on the custom circuit board. If the user had selected the AdvancedTCA option from the first set of predetermined design options 302, the third set of predetermined design options 306 may relate to Advanced MC expansion slots.

Figure 3E:
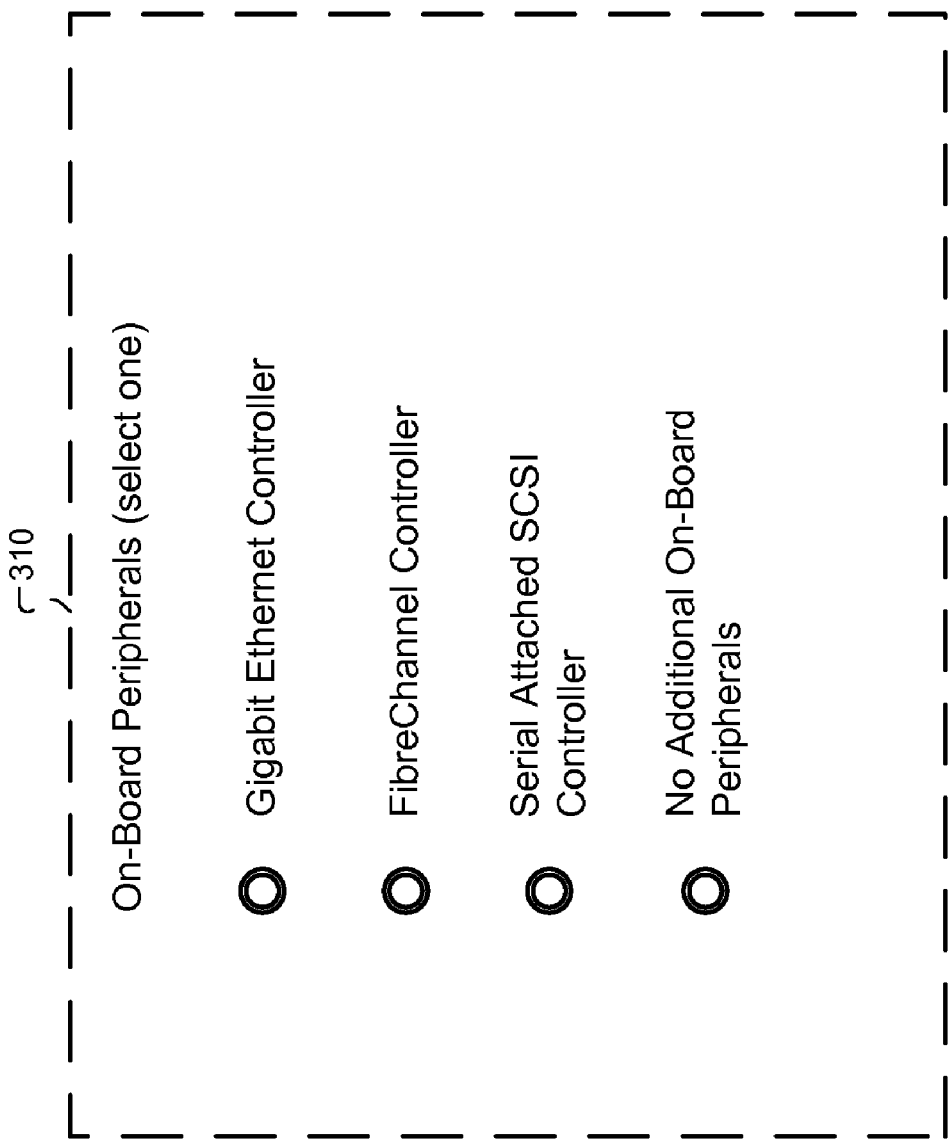

The user may also be presented with a fifth set of predetermined design options 310 as shown in FIG. 3E. For example only, the fifth set of predetermined design options 310 may relate to on-board peripherals to be implemented on the custom circuit board. In some implementations, the user interface module 102 provides the design specifications to the HDL module 106 when each design specification selection is made by the user. In other implementations, the user interface module 102 provides the design specifications to the HDL module 106 after the user has input all of the design specifications for the custom circuit board.

Referring again to FIG. 2, the HDL module 106 includes a planner module 202, a code generator module 204, and a schematic module 206. The HDL module 106 also includes a bill of materials (BOM) module 208, a placement optimizer module 210, and a setup module 212.

The planner module 202 selects the components to be implemented on the custom circuit board based on the design specifications. More specifically, the planner module 202 selects the components to be implemented on the custom circuit board from predefined component data stored in the database 104. The planner module 202 generates initial design data based on the components selected and provides the initial design data to the code generator module 204. For example only, the initial design data may be provided to the planner module 202 in a data file having a .DAT file extension.

Figure 4:
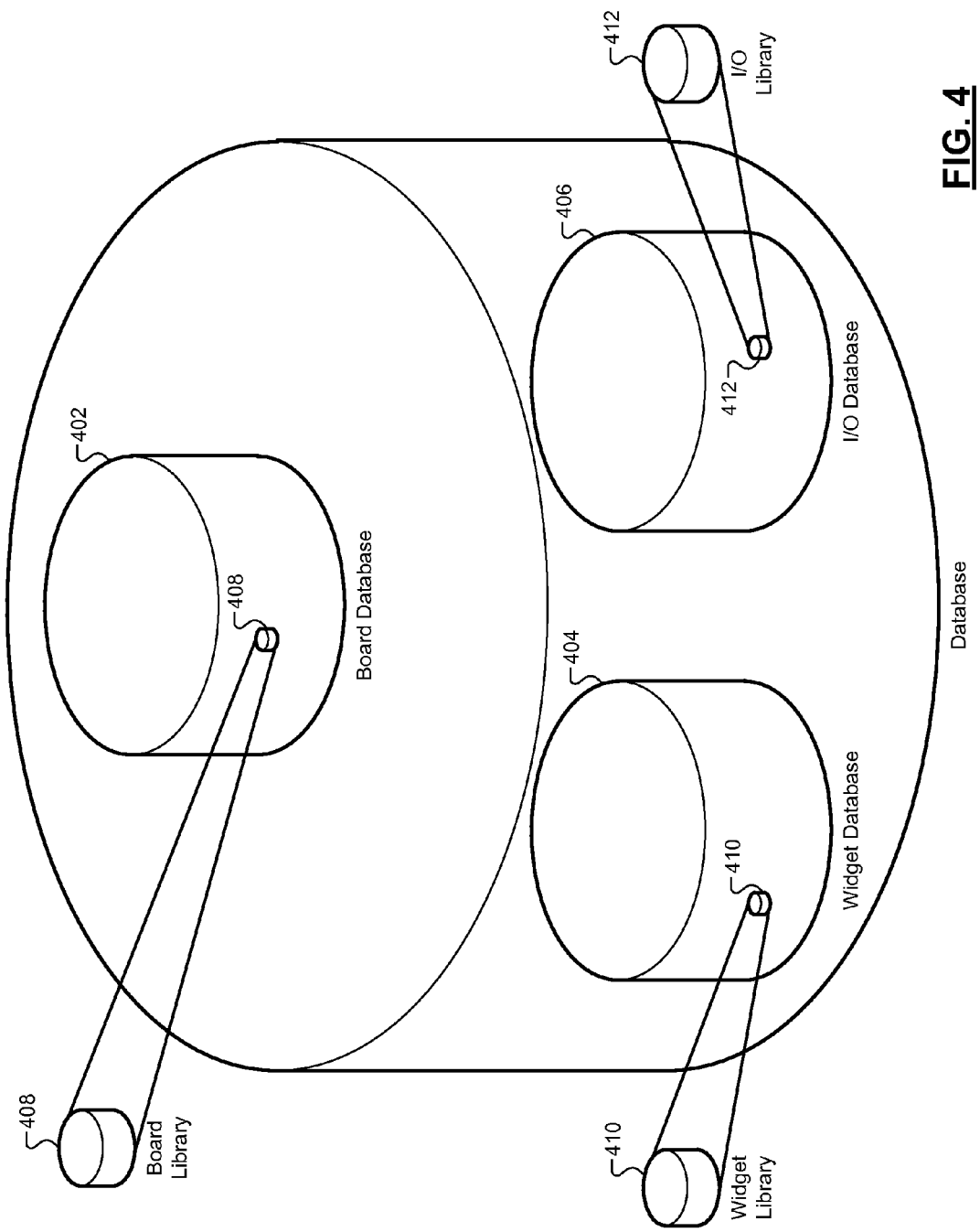
FIG. 4 is an exemplary illustration of a database that may be used in producing a custom circuit board.

FIG. 4 is an exemplary illustration of the database 104. The database 104 includes data describing predefined components that may satisfy one or more of the design specifications. The planner module 202 selects the components from the predefined components.

In some implementations, the database 104 includes sub-databases. For example only, the database 104 may include a board database 402, a widget database 404, and an input/output (I/O) database 406. In other implementations, the board database 402, the widget database 404, and/or the I/O database 406 may be implemented independently of each other and/or independently of the database 104.

The board database 402 includes a library for each circuit board form factor that may be customized by the user. For example only, the board database 402 may include a library for an ATX board, a flex-ATX board, a micro-ATX board, an ITX board, a nano-ITX board, a mini-ITX board, a mobile-ITX board, and a pico-ITX board. The board database 402 may also include a library for a BTX board, a WTX board, an AT board, a baby-AT board, an LPX board, and an NLX board. The board database 402 may also include a library for an EBX board, an EPIC board, an ESM board, an ESM-Express board, and other suitable circuit board form factors.

A library for a given circuit board form factor (i.e., a board library) 408 includes data that describes the circuit board. For example only, the board library 408 of the circuit board may include data describing the dimensions of the circuit board, the shape of the circuit board, height constraints of the circuit board, and unusable zones (e.g., boundary zones) of the circuit board.

The board library 408 may also include data describing airflow zones on the circuit board, three-dimensional areas that define contiguous regions on the circuit board, whether the circuit board uses a heat spreader, and slots that may be implemented on the circuit board. The board library 408 may also include data describing I/O ports accessible via a front-panel of casing in which the circuit board may be implemented, I/O ports accessible via a rear-panel of the casing, internal I/O ports on the circuit board. The board library 408 may also include HDL for the circuit board, a locator for the HDL, a cost of the circuit board, and other suitable characteristics of the circuit board.

The widget database 404 includes libraries for each component that may be implemented on one or more of the circuit board form factors. For example only, the widget database 404 may include libraries described in terms of processors, I/O ports, connectors, slots, and switches. The widget database 404 may also include libraries described in terms of joint test action group (JTAG) expanders and power supplies. Each processor, I/O port, connector, slot, switch, JTAG expander, and power supply may be referred to as a widget.

A processor incorporates a processor chip (e.g., a CPU), memory and a memory controller, a PCI-Express root hub, a universal serial bus (USB) hub, power management control, reset control, and setup for the processor (e.g., BIOS or EFI). A processor may also provide additional I/O interfaces (e.g., Ethernet or SATA). One processor can be implemented on the custom circuit board.

An I/O port connects to the processor via a PCI-Express port (and possibly a PCI-Express switch). The number of I/O ports implemented on the custom circuit board may be limited by the dimensions of the form factor selected, connectivity on the custom circuit board, and power limitations.

A connector adds an I/O connection point to the custom circuit board. A given connector may be, for example, an edge-mounted connector or an on-board header. The number of connectors that may be implemented on the custom circuit board may be limited by the dimensions of the form factor selected, connectivity on the custom circuit board, and power limitations. Each I/O port on a connector is connected to a controller or a hub.

A slot introduces one or more interconnect expansion ports to the custom circuit board without the need for implementing a connector. Examples of slots include, but are not limited to, a PCI-Express slot on an ATX motherboard, a ComExpress connector on a ComExpress module, and gold edge-fingers on an advancedMC module. The number of slots that may be implemented on the custom circuit board may be limited by the form factor selected.

A switch provides an additional interconnect with either a universal serial bus (USB) port or a PCI-Express port and includes one upstream port and one or more downstream ports. A JTAG expander provides a fan-out to one or more boundary scan (BSCAN) components. A JTAG expander provides one upstream port and one or more downstream ports and may be included in the design of the custom circuit board with a connector. A power supply provides power to a 3.3 a 3.3 V power rail, a 5.0 V power rail, a 12.0 V power rail, and a 12.0 V standby power. The power supply for some circuit board form factors (e.g., an ATX board) may include or be a connector.

A library for a given widget (i.e., a widget library) 410 includes data that describes the widget. For example only, data that may be included in the widget library 410 includes:
(1) dimensions of the widget;
(2) locations (e.g., coordinates) on the widget to be used in optimizing the placement of components on the custom circuit board;
(3) whether the widget uses a heat spreader;
(4) a mapping of physical I/O ports of the widget to the widget's logical I/O ports;
(5) configuration sets for the widget's I/O ports (A configuration set describes a set of I/O configurations that can be selected for a group of I/O pins);
(6) configuration sets for the widget's PCI-Express connections, where a configuration set describes a set of configurations that can be applied to a group of PCI-Express ports;
(7) a mapping of each of the widget's logical PCI-Express interconnect ports to the widget's physical PCI-Express ports;
(8) amount of power that the widget consumes from the 3.3 V power rail, the 5.0 V power rail, and the 12.0 V power rail;
(9) amount of power that the widget consumes from the 12.0 V standby power rail;
(10) a preferred direction of airflow (e.g, vertical, horizontal, or either);
(11) setup data;
(12) a locator for the setup data;
(13) a locator for script to be used to modify the setup data;
(14) HDL;
(15) a locator for the HDL;
(16) testing data;
(17) a locator for the testing data;
(18) a locator for an electrical design for the widget;
(19) a locator for a layout of the widget;
(20) a bill of materials (BOM) for the widget;
(21) a locator for the BOM;
(22) a cost of the widget;
(23) a vendor of the widget;
(24) a device identifier for the widget;
(25) whether the widget is an edge connector; and
(26) the location of the edge of the widget that should be aligned with a card-edge.

The widget library 410 of the given widget may include data describing the characteristics (1)-(26) depending on whether the characteristic is relevant to the widget. For example only, the widget library of a processor may include data describing the characteristics (1)-(23) as they pertain to the processor. The widget library of an I/O port may include data describing the characteristics (1)-(8), (10)-(12), and (14)-(24) as they pertain to the I/O port. In some implementations, the widget library of an I/O port may be implemented in an I/O library within the I/O database 406. The I/O database 406 may include an I/O library 412 for each widget's I/O that may be implemented on the custom circuit board.

The widget library of a connector widget may include data describing the characteristics (1)-(2), (4)-(5), (8), (10), (14)-(22), and (25)-(26) as they pertain to the connector. The widget library of a slot may include data describing the characteristics (1)-(2), (4)-(9), and (14)-(22) as they pertain to the slot. The widget library of a switch may include data describing the characteristics (1)-(2), (4)-(8), (10), and (14)-(24) as they pertain to the switch.

The widget library of a JTAG expander may include data describing the characteristics (1)-(2), (4)-(5), (8), (10), and (14)-(22) as they pertain to the JTAG expander. The widget library of a power supply may include data describing the characteristics (1)-(5), (8)-(9), and (14)-(22) as they pertain to the power supply.

Referring again to FIG. 2, the planner module 202 may include a solver module 220 and a placement module 222 in some implementations. The solver module 220 selects the components (i.e., widgets) to be implemented on the custom circuit board from the predefined component data stored in the database 104.

When one or more the predefined components or combinations of the predefined components are capable of achieving the user's design specifications, the solver module 220 may select the components to be implemented on the custom circuit board to minimize cost, maximize speed, memory, bandwidth, or a suitable combination of one or more characteristics. The solver module 220 also selects the components to be implemented on the custom circuit based on the dimensions of the form factor selected, the dimensions of the components, power consumption, airflow, and other constraints. More specifically, the solver module 220 selects the components to avoid conflicting with constraints of the components themselves or constraints of the circuit board.

The solver module 220 may add additional components to accommodate the design specifications when implementation of the selected components would exceed the dimensional constraints of the circuit board. For example only, the solver module 220 may add a PCI-Express switch to accommodate one or more PCI-Express connections that could not be implemented on the circuit board due to the dimensional constraints of the circuit board. For example only, the solver module 220 may select the components to be implemented on the custom circuit board using an analysis similar or identical to that shown in FIG. 5.

Referring to FIG. 5, an exemplary analysis that may be employed in selecting the components (or widgets) to be implemented on the custom circuit board is presented. The solver module 220 may determine one component 502 that would provide one or more of the user's design specifications and assume that the component 502 must be implemented on the custom circuit board. The solver module 220 determines which of the design specifications remain unsatisfied and determines which component or combinations of components from the predetermined design options will satisfy one or more of the unsatisfied design specifications. The solver module 220 adds components until the design specifications have been satisfied. For example only, a first possible combination of components that satisfies the design specification and does not conflict with constraints is depicted by 504.

After determining the first possible component combination 504, the solver module 220 may remove one or more of the components used in the first possible component combination 504 as depicted by 506. The solver module 220 may determine whether another component or a combination of components may be implemented to satisfy the unsatisfied design specifications. For example only, possible component combinations 508, 510, and 512 may be implemented using more components than the first possible component combination 504.

The solver module 220 may compare the cost to produce the first possible component combination 504 with the possible component combinations 508, 510, and 512. However, the cost of producing the possible component combinations 508, 510, or 512 may be greater than the cost of producing the first possible component combination 504 or one or more constraints may be exceeded.

When a constraint is exceeded or the cost of producing a possible component combination is greater than the cost of the first possible component combination 504, the solver module 220 may abandon pursuing the possible component combination. The solver module 220 may return to the first possible component combination 502 and remove a different component from the first possible component combination 502 as depicted by 514. The solver module 220 may continue upon this iterative analysis of combinations of predetermined design options until a best possible component combination, as defined by a number of criteria, has been determined and other combinations of the components have been exhausted. An exemplary best possible component combination is depicted as 516.

Referring again to FIG. 2, the placement module 222 determines a placement or arrangement for the selected components on the circuit board. The placement module 222 arranges the components to avoid conflicting with the dimensional constraints of the custom circuit board. The placement module 222 also ensures that the selected components are arranged to provide optimum airflow across the circuit board and the components while minimizing power consumption.

Data describing the components selected by the solver module 220 and the placement of the components determined by the placement module 222 is included in the initial design data for the custom circuit board. The planner module 202 provides the initial design data to the code generator module 204.

In some implementations, the code generator module 204 may generate a schematic or another illustration of an initial design for the custom circuit board and provide the initial design to the user for approval or disapproval. In such implementations, the code generator module 204 may wait for the user's approval before proceeding. If the user disapproves, the planner module 202 may be prompted to create a different design for the custom circuit board. The different design may include one or more different components (e.g., higher cost) from the database 104 and/or a different arrangement of the same components.

The code generator module 204 receives the initial design data and retrieves hardware description language (HDL) corresponding to each of the components to be implemented on the custom circuit board as specified in the initial design. For example only, the HDL may include HDL written in Verilog, VHDL, System C, or another suitable HDL. The code generator module 204 generates an initial netlist that describes connections between the components to be implemented on the custom circuit board. The code generator module 204 also generates other data as discussed further below.

The code generator module provides the initial netlist to the schematic module 206. The schematic module 206 generates a final netlist, a bill of materials (BOM), and a board layout for the custom circuit board based on the initial netlist. For example only, the schematic module 206 may employ a Cadence Allegro System Architect (ASA) to import the initial netlist and generate the final netlist, the BOM, and the board file based on the initial netlist. The final netlist includes data describing all of the connections to be made on the custom circuit board.

The BOM includes data describing the components to be implemented on the custom circuit board and the quantities of each of the components to be used in producing the custom circuit board. The schematic module 206 provides the BOM to the BOM module 208. The BOM module 208 receives the BOM from the schematic module 206 and BOM modification data from the code generator module 204.

The code generator module 204 generates the BOM modification data. For example only, the BOM modification data may be included in a modification file having an engineering change order (.ECO) file extension. The BOM modification data may include data describing one or more differences between the initial netlist and the final netlist. The BOM module 208 modifies the BOM based on the BOM modification data and outputs the BOM to the circuit board producer 108.

The board layout generated by the schematic module 206 may include a schematic or initial placement to be used by the circuit board producer 108 in creating the custom circuit board. For example only, an initial component placement may be included in a board file having a .BRD file extension or another type of file that may be used by circuit board producers using a computer aided design (CAD) tool in producing custom circuit boards.

The placement optimizer module 210 receives the initial board placement from the schematic module 206 and the initial design data from the code generator module 204. The placement optimizer module 210 determines whether a more suitable arrangement of the components to be implemented on the custom circuit board may be found. For example only, the placement optimizer module 210 may perform a rubber-band placement technique based on the locations (e.g., coordinates) on each the components on the board.

The theoretical rubber-band placement technique may be similar to attaching rubber bands to between the components about the locations on the components to be implemented on the custom circuit board. The tension on a given rubber band attached between two of the components may be a function of length constraints of routes between the two components, bandwidth of data passing between the two components, and the distance between the two components. The tension may increase as the bandwidth increases, as the distance increases, or as the length constraints are more strict.

Once all of the rubber bands have been attached, the placement optimizer module 210 allows the components to be implemented on the custom circuit board to shift as they would theoretically under the tension of the rubber bands and the constraints. Exemplary constraints include, for example, some of the components may be fixed and cannot move (e.g., slots), some components may only move in certain directions (e.g., edge connectors), the components cannot overlap, the components cannot be located wholly or partially off of the custom circuit board, and the components cannot move to areas where they would exceed height constraints.

The placement optimizer module 210 generates placement data and transmits the placement data to the circuit board producer 108. For example, the placement optimizer module 210 may generate the placement data corresponding to the more suitable arrangement of the components when one has been determined. Otherwise, the placement optimizer module 210 may output the placement data according to the placement data determined by the planner module 202. In some implementations, the placement data may be included in a placement file having an engineering change order (.ECO) file extension. The placement optimizer module 210 provides the placement data to the circuit board producer 108.

The code generator module 204 also generates setup data for the processor that is to be implemented on the custom circuit board and provides the setup data to the setup module 212. The setup data includes a mapping of the I/O components to be implemented on the custom circuit board along with the vendor and the device identifier for each of the I/O component. The setup data also includes a mapping for power management on the custom circuit board. The setup data also includes setup data for the processor (e.g., BIOS or EFI) to be implemented on the custom circuit board. The setup module 212 provides the setup data to the circuit board producer 108.

The setup data, the BOM, the final netlist, and the placement data may be provided to the circuit board producer 108. In some implementations, another module may be implemented within the HDL module 106 to assemble the data into a single file that is to be provided to the circuit board producer 108. The circuit board producer 108 produces the custom circuit board with the components arranged on the custom circuit board according to the placement data and connected according to the final netlist. The circuit board producer 108 also utilizes the setup data. In this manner, the custom circuit board is produced according to the design specifications input by the user.

Automating the design process for a custom circuit board reduces the period of time necessary to produce the custom circuit board. Automating the design process also enables cost savings to be passed along to customers. In terms of production time, automating the design process decreases the period of time necessary to produce the custom circuit board to approximately one-month. Production of the custom circuit board using the custom circuit board production system 100 may also significantly reduce design costs.

Figure 6A:
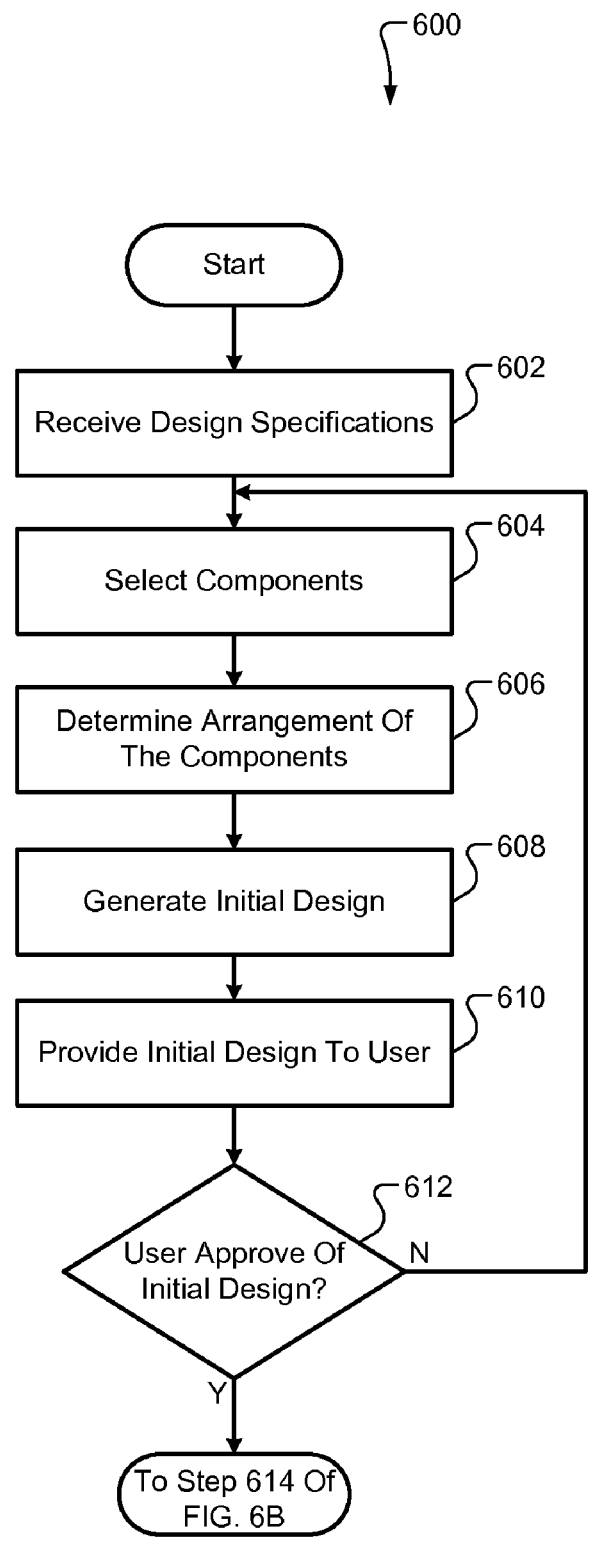
FIGS. 6A-6B are a flowchart depicting an exemplary method.
Figure 6B:
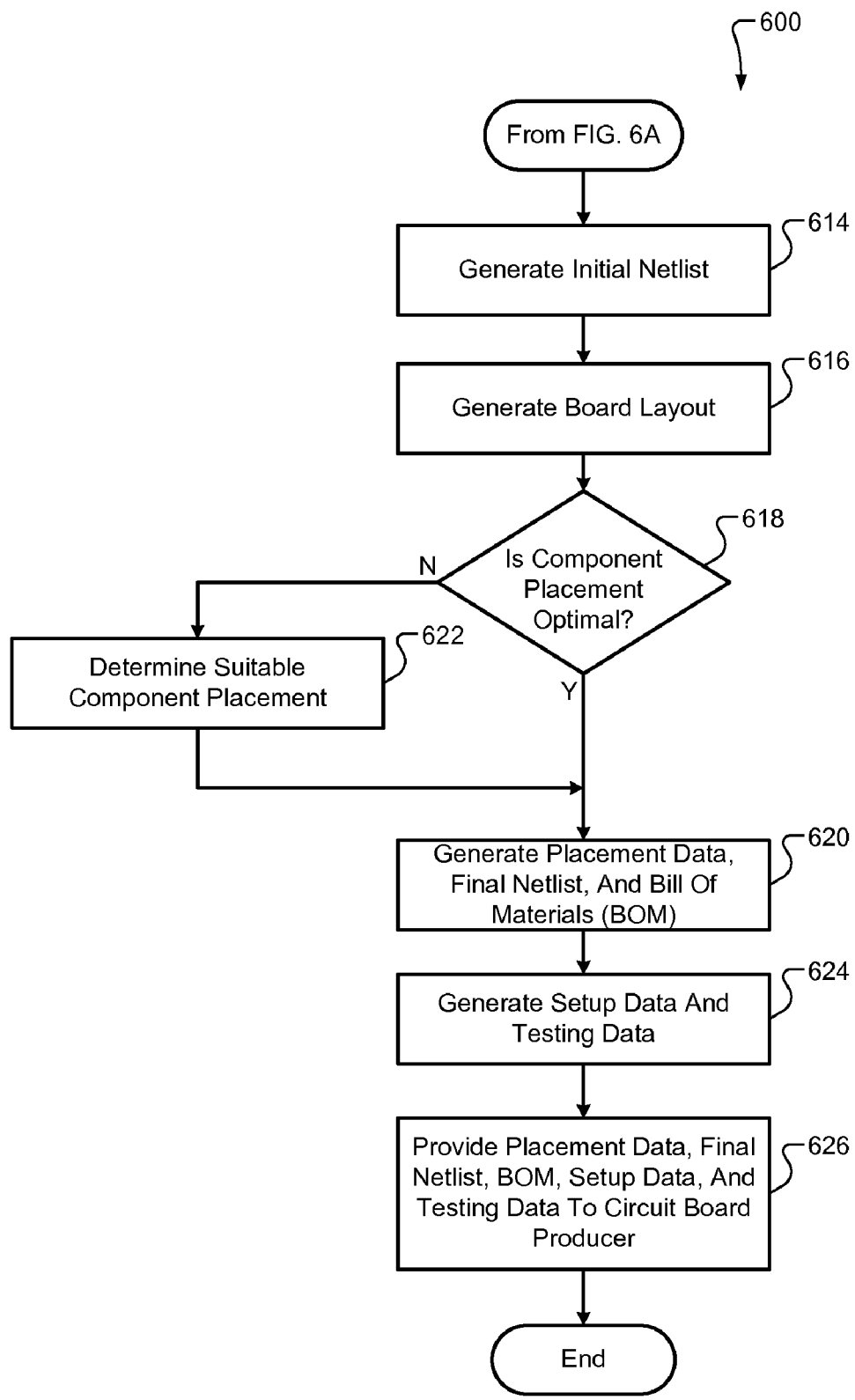

Referring now to FIGS. 6A-6B, flowcharts depicting an exemplary method 600 is presented. The method 600 begins in block 602 of FIG. 6A where the method 600 receives the design specifications for the custom circuit board. The method 600 selects components to be implemented on the custom circuit board to satisfy the design specifications in block 604. For example only, the method 600 may employ an analysis of the predefined components as described above with respect to FIG. 5.

In block 606, the method 600 determines the arrangement for the components selected to be implemented on the custom circuit board. The method 600 generates the initial design for the custom circuit board in block 608. In some implementations, the method 600 then proceeds to block 614 of FIG. 6B. In other implementations, the method 600 proceeds to block 610 where the method 600 provides the initial design to the user.

The method 600 determines whether the user approves of the initial design in block 612. If so, the method 600 continues to block 614 of FIG. 6B; otherwise, the method 600 returns to block 604. The method 600 may then select different components to be implemented on the custom circuit board or a different arrangement for the selected components.

Referring to FIG. 6B, the method 600 generates the initial netlist for the custom circuit board in block 614. The method 600 generates the initial component placement for the custom circuit board in block 616 and determines whether the placement of the components is optimal in block 618. If so, the method 600 continues to block 620; otherwise, the method 600 determines a suitable placement for the components in block 622 and proceeds to block 620. For example only, the method 600 may determine the suitable placement using the theoretical rubber band technique discussed above.

The method 600 generates the placement data, the final netlist, and the BOM for the circuit board producer in block 620 and proceeds to block 624. In block 624, the method 600 generates the setup data required for the custom circuit board. The method 600 provides the placement data, the final netlist, the BOM, and the setup data to the circuit board producer 108 in block 626. The circuit board producer 108 then produces the custom circuit board according to the data provided.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
an input that receives design specifications for a custom circuit board, wherein the design specifications are selected from predetermined design options for custom circuit boards; and
a hardware description language (HDL) module that generates a HDL corresponding to the design specifications and that outputs the HDL to a circuit board producer.

2. The system of claim 1 wherein the custom circuit board includes one of a motherboard, a computer on module (COM) board, and an advanced telecom computing architecture (ATCA) blade board, a CompactPCI (CPCI) blade board, and a VME blade board.

3. The system of claim 1 wherein the HDL module selects components to be implemented on the custom circuit board based on the design specifications and generates the HDL according to the components.

4. The system of claim 3 wherein the HDL module selects the components from predefined components stored in a database and generates the HDL based on HDL data stored for the predefined components.

5. The system of claim 4 wherein the predefined components include circuit board form factors, processors, input/output (I/O) ports, connectors, slots, switches, joint test action group (JTAG) expanders, and power supplies.

6. The system of claim 3 wherein the HDL module determines an arrangement for the components on the custom circuit board and generates the HDL and component placement for the custom circuit board based on the arrangement.

7. The system of claim 6 wherein the HDL module performs an optimal placement analysis based on a layout and coordinates on the components and selectively updates the layout based on a result of the optimal placement analysis.

8. The system of claim 3 wherein the HDL module generates a HDL netlist, a bill of materials, a placement for the components, and setup data.

9. The system of claim 1 wherein the HDL module generates the HDL in one of a Verilog language, a very high-speed integrated circuit HDL (VHDL) language, and a System C language.

10. The system of claim 1 wherein the HDL module generates an initial design for the custom circuit board based on the design specifications, outputs the initial design, and delays generating and outputting the HDL until an approval for the initial design has been received.

11. The system of claim 1 wherein the design specifications include at least a form factor for the custom circuit board and a processor.

12. The system of claim 11 wherein the design specifications further include a description of at least one of memory, a number of expansion slots, and on-board peripherals.

13. The system of claim 11 wherein the design specifications further include a description of memory, a number of expansion slots, and on-board peripherals.

14. A system comprising:
a planner module that receives design specifications input for production of a custom circuit board, that selects components for the custom circuit board based on the design specifications, that determines an arrangement for the components on the custom circuit board, and that generates initial design data for the custom circuit board based on the components and the arrangement; and
a code generator module that generates a hardware description language (HDL) that is provided to a circuit board producer for production of the custom circuit board based on the initial design data.

15. The system of claim 14 wherein the code generator module generates an initial design for the custom circuit board based on the initial design data, outputs the initial design, and delays generation of the HDL until an approval for the initial design has been received.

16. The system of claim 14 further comprising a schematic module that finalizes a design for the custom circuit board including detailing electrical connections of the custom circuit board, that generates a final netlist corresponding to the design, and that provides the final netlist to the circuit board producer.

17. The system of claim 16 further comprising a bill of materials (BOM) module that generates a BOM corresponding to the design and provides the BOM to the circuit board producer.

18. The system of claim 16 further comprising a placement module that performs an optimal placement analysis for the components of the design, that selectively updates a placement of the components for the custom circuit board based on a result of the optimal placement analysis, and that provides the placement to the circuit board producer.

19. The system of claim 14 wherein the custom circuit board includes one of a motherboard, a computer on module (COM) board, an advanced telecom computing architecture (ATCA) blade board, a CompactPCI (CPCI) blade board, and a VME blade board.

20. The system of claim 14 wherein a user selects the design specification from predetermined design options presented to the user.

21. The system of claim 14 wherein the planner module selects the components from predefined components stored in a database that satisfy one or more of the design specifications and generates the initial design data based on HDL data for the components selected.

22. The system of claim 21 wherein the predefined components include circuit board form factors, processors, input/output (I/O) ports, connectors, slots, switches, joint test action group (JTAG) expanders, and power supplies.

23. The system of claim 14 wherein the code generator module generates the HDL in one of a Verilog language, a very high-speed integrated circuit HDL (VHDL) language, and a System C language.

24. The system of claim 14 wherein the design specifications include at least a form factor for the custom circuit board and a processor.

25. The system of claim 24 wherein the design specifications further include a description of at least one of memory, a number of expansion slots, and on-board peripherals.

26. The system of claim 24 wherein the design specifications further includes a description of memory, a number of expansion slots, and on-board peripherals.

27. A system comprising:
a planner module that receives design specifications for a custom circuit board, that selects components for the custom circuit board based on the design specifications, that determines an arrangement for the components on the custom circuit board, and that generates initial design data for the custom circuit board based on the components and the arrangement; and
a code generator module that generates a hardware description language (HDL) that is provided to a circuit board producer for production of the custom circuit board based on the initial design data,
wherein the custom circuit board includes one of a motherboard, a computer on module (COM) board, an advanced telecom computing architecture (ATCA) blade board, a CompactPCI (CPCI) blade board, and a VME blade board,
wherein the design specifications are selected from predetermined design options, and
wherein the planner module selects the components for the custom circuit board from predefined components stored in a database.

28. The system of claim 27 wherein the predefined components include circuit board form factors, processors, input/output (I/O) ports, connectors, slots, switches, joint test action group (JTAG) expanders, and power supplies.

29. The system of claim 27 wherein the code generator module generates an initial design for the custom circuit board based on the initial design data, outputs the initial design, and delays generation of the HDL until an approval for the initial design has been received.

30. The system of claim 27 further comprising a schematic module that finalizes a design for the custom circuit board including detailing electrical connections of the custom circuit board, that generates a final netlist corresponding to the design, and that provides the final netlist to the circuit board producer.

31. The system of claim 30 further comprising a bill of materials (BOM) module that generates a BOM corresponding to the design and provides the BOM to the circuit board producer.

32. The system of claim 30 further comprising a placement module that performs an optimal placement analysis for the components of the design, that selectively updates a placement of the components for the custom circuit board based on a result of the optimal placement analysis, and that provides the placement to the circuit board producer.

33. The system of claim 27 wherein the code generator module generates the HDL in one of a Verilog language, a very high-speed integrated circuit HDL (VHDL) language, and a System C language.

34. The system of claim 27 wherein the design specifications include at least a form factor for the custom circuit board and a processor.

35. The system of claim 34 wherein the design specifications further include a description of at least one of memory, a number of expansion slots, and on-board peripherals.

36. The system of claim 34 wherein the design specifications further includes a description of memory, a number of expansion slots, and on-board peripherals.

37. A method including a processor with memory comprising:
receiving design specifications for a custom circuit board, wherein the design specifications are selected from pre-determined design options for custom circuit boards;
generating a hardware description language (HDL) corresponding to the design specifications; and
outputting the HDL to a circuit board producer using the processor.

38. The method of claim 37 wherein the custom circuit board includes one of a motherboard, a computer on module (COM) board, an advanced telecom computing architecture (ATCA) blade board, a CompactPCI (CPCI) blade board, and a VME blade board.

39. The method of claim 37 further comprising:
selecting components to be implemented on the custom circuit board based on the design specifications; and
generating the HDL according to the components.

40. The method of claim 39 further comprising:
selecting the components from predefined components stored in a database; and
generating the HDL based on HDL data stored for the predefined components.

41. The method of claim 40 wherein the predefined components include circuit board form factors, processors, input/output (I/O) ports, connectors, slots, switches, joint test action group (JTAG) expanders, and power supplies.

42. The method of claim 39 further comprising:
determining an arrangement for the components on the custom circuit board; and
generating the HDL including a placement for the custom circuit board based on the arrangement.

43. The method of claim 42 further comprising:
performing an optimal placement analysis based on a layout and coordinates on the components; and
selectively updating the layout based on a result of the optimal placement analysis.

44. The method of claim 39 wherein the HDL module generates an HDL netlist, a bill of materials, a placement for the components, testing data, and setup data.

45. The method of claim 37 further comprising generating the HDL in one of a Verilog language, a very high-speed integrated circuit HDL (VHDL) language, and a System C language.

46. The method of claim 37 further comprising:
generating an initial design for the custom circuit board based on the design specifications;
outputting the initial design; and
delaying the generating and outputting the HDL until an approval for the initial design has been received.

47. The method of claim 37 wherein the design specifications include at least a form factor for the custom circuit board and a processor.

48. The method of claim 47 wherein the design specifications further include a description of at least one of memory, a number of expansion slots, and on-board peripherals.

49. The method of claim 47 wherein the design specifications further include a description of memory, a number of expansion slots, and on-board peripherals.

50. A method including a processor and memory comprising:
receiving design specifications for a custom circuit board;
selecting components for the custom circuit board based on the design specifications;
determining an arrangement for the components on the custom circuit board;
generating initial design data for the custom circuit board based on the components and the arrangement; and
generating a hardware description language (HDL) using the processor that is output to a circuit board producer for production of the custom circuit board based on the initial design data,
wherein the custom circuit board includes one of a motherboard, a computer on module (COM) board, an advanced telecom computing architecture (ATCA) blade board, a CompactPCI (CPCI) blade board, and a VME blade board,
wherein the design specifications are selected from predetermined design options, and
wherein the components are selected from predefined components stored in a database.

51. The method of claim 50 wherein the predefined components include circuit board form factors, processors, input/output (I/O) ports, connectors, slots, switches, joint test action group (JTAG) expanders, and power supplies.

52. The method of claim 50 further comprising:
generating an initial design for the custom circuit board based on the initial design data;
outputting the initial design; and
delaying generation of the HDL until an approval for the initial design has been received.

53. The method of claim 50 further comprising:
finalizing a design for the custom circuit board including detailing electrical connections of the custom circuit board;
generating a final netlist corresponding to the design; and
providing the final netlist to the circuit board producer.

54. The method of claim 53 further comprising:
generating a BOM corresponding to the design; and
providing the BOM to the circuit board producer.

55. The method of claim 53 further comprising:
performing an optimal placement analysis for the components of the design;
selectively updating a placement of the components for the custom circuit board based on a result of the optimal placement analysis; and
providing the placement to the circuit board producer.

56. The method of claim 50 further comprising generating the HDL in one of a Verilog language, a very high-speed integrated circuit HDL (VHDL) language, and a System C language.

57. The method of claim 50 wherein the design specifications include at least a form factor for the custom circuit board and a processor.

58. The method of claim 57 wherein the design specifications further include a description of at least one of memory, a number of expansion slots, and on-board peripherals.

59. The method of claim 57 wherein the design specifications further includes a description of memory, a number of expansion slots, and on-board peripherals.

60. A method including a processor and a memory for producing a custom circuit board, the method comprising:

receiving design specifications for the custom circuit board, wherein the design specifications are selected from predetermined design options for custom circuit boards;

generating a hardware description language (HDL) corresponding to the design specifications;

outputting the HDL to a circuit board producer; and producing the custom circuit board according to the HDL using the processor.

61. The method of claim 60 wherein producing the custom circuit board further comprises at least one of:

routing the custom circuit board according to the HDL to define routes;

applying an electrically conductive material to the routes;

attaching components to the custom circuit board;

establishing electrical connections as specified in the HDL; and uploading setup data to the custom circuit board.

62. The method of claim 60 wherein the custom circuit board includes one of a motherboard, a computer on module (COM) board, an advanced telecom computing architecture (ATCA) blade board, a CompactPCI (CPCI) blade board, and a VME blade board.

63. The method of claim 60 further comprising:

selecting components to be implemented on the custom circuit board based on the design specifications; and generating the HDL according to the components.

64. The method of claim 63 further comprising:

selecting the components from predefined components stored in a database; and generating the HDL based on HDL data stored for the predefined components.

65. The method of claim 64 wherein the predefined components include circuit board form factors, processors, input/output (I/O) ports, connectors, slots, switches, joint test action group (JTAG) expanders, and power supplies.

66. The method of claim 63 further comprising:

determining an arrangement for the components on the custom circuit board; and generating the HDL including a placement for the custom circuit board based on the arrangement.

67. The method of claim 66 further comprising:

performing an optimal placement analysis based on the layout and coordinates on the components; and selectively updating the layout based on a result of the optimal placement analysis.

68. The method of claim 63 wherein the HDL module generates an HDL netlist, a bill of materials, a placement for the components, testing data, and setup data.

69. The method of claim 60 further comprising generating the HDL in one of a Verilog language, a very high-speed integrated circuit HDL (VHDL) language, and a System C language.

70. The method of claim 60 further comprising:

generating an initial design for the custom circuit board based on the design specifications;

outputting the initial design; and delaying the generating and outputting the HDL until an approval for the initial design has been received.

71. The method of claim 60 wherein the design specifications include at least a form factor for the custom circuit board and a processor.

72. The method of claim 71 wherein the design specifications further include a description of at least one of memory, a number of expansion slots, and on-board peripherals.

73. The method of claim 71 wherein the design specifications further include a description of memory, a number of expansion slots, and on-board peripherals.

74. A method including a processor and memory for producing a custom circuit board, the method comprising:

receiving design specifications for the custom circuit board;

selecting components for the custom circuit board based on the design specifications;

determining an arrangement for the components on the custom circuit board;

generating initial design data for the custom circuit board based on the components and the arrangement;

generating a hardware description language (HDL) based on the initial design data using the processor; and producing the custom circuit board in accordance with the HDL, wherein the custom circuit board includes one of a motherboard, a computer on module (COM) board, an advanced telecom computing architecture (ATCA) blade board, a CompactPCI (CPCI) blade board, and a VME blade board, wherein the design specifications are selected from predetermined design options, and wherein the components are selected from predefined components stored in a database.

75. The method of claim 74 wherein producing further comprises at least one of:

routing the custom circuit board according to the HDL to define routes;

applying an electrically conductive material to the routes;

attaching components to the custom circuit board;

establishing electrical connections as specified in the HDL; and uploading setup data to the custom circuit board.

76. The method of claim 74 wherein the predefined components include circuit board form factors, processors, input/output (I/O) ports, connectors, slots, switches, joint test action group (JTAG) expanders, and power supplies.

77. The method of claim 74 further comprising:

generating an initial design for the custom circuit board based on the initial design data;

outputting the initial design; and delaying generation of the HDL until an approval for the initial design has been received.

78. The method of claim 74 further comprising:

finalizing a design for the custom circuit board including detailing electrical connections of the custom circuit board;

generating a final netlist corresponding to the design; and providing the final netlist to the circuit board producer.

79. The method of claim 78 further comprising:

generating a BOM corresponding to the design; and providing the BOM to the circuit board producer.

80. The method of claim 78 further comprising:

performing an optimal placement analysis for the components of the design;

selectively updating a placement of the components for the custom circuit board based on a result of the optimal placement analysis; and providing the placement to the circuit board producer.

81. The method of claim 74 further comprising generating the HDL in one of a Verilog language, a very high-speed integrated circuit HDL (VHDL) language, and a System C language.

82. The method of claim 74 wherein the design specifications include at least a form factor for the custom circuit board and a processor.

83. The method of claim 82 wherein the design specifications further include a description of at least one of memory, a number of expansion slots, and on-board peripherals.

84. The method of claim 82 wherein the design specifications further includes a description of memory, a number of expansion slots, and on-board peripherals.

* * * * *